United States Patent
Itatani et al.

(10) Patent No.: US 6,576,481 B2
(45) Date of Patent: Jun. 10, 2003

(54) METHOD OF MANUFACTURING SEMICONDUCTOR DEVICES

(75) Inventors: Hideharu Itatani, Tokyo (JP); Masayuki Tsuneda, Tokyo (JP); Atsushi Sano, Tokyo (JP); Tsukasa Ohoka, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 09/962,112

(22) Filed: Sep. 26, 2001

(65) Prior Publication Data

US 2002/0072211 A1 Jun. 13, 2002

(30) Foreign Application Priority Data

Dec. 13, 2000 (JP) ........................ 2000-379305

(51) Int. Cl.[7] .................. H01L 21/00; H01L 21/8242; H01L 21/28; H01L 21/42; H01L 21/4763
(52) U.S. Cl. ..................... 438/3; 438/575; 438/650; 438/240
(58) Field of Search ............... 438/3, 14, 240, 438/575, 650, 686

(56) References Cited

U.S. PATENT DOCUMENTS

| | | | | |
|---|---|---|---|---|
| 5,254,176 A | * | 10/1993 | Ibuka et al. | 134/2 |
| 5,294,262 A | * | 3/1994 | Nishimura | 134/22.1 |
| 6,060,034 A | * | 5/2000 | Tsukamoto | 423/240 S |
| 6,100,562 A | * | 8/2000 | Yamazaki et al. | 257/347 |
| 6,186,154 B1 | * | 2/2001 | Huang | 438/5 |
| 6,279,503 B1 | * | 8/2001 | Choi et al. | 118/715 |
| 6,322,597 B1 | * | 11/2001 | Ohta | 438/14 |
| 6,352,865 B2 | * | 3/2002 | Lee et al. | 438/240 |

FOREIGN PATENT DOCUMENTS

| | | | | |
|---|---|---|---|---|
| JP | 8-78396 | | 3/1996 | |
| JP | 2000-58529 | | 2/2000 | |
| WO | WO 99/34428 | * | 7/1999 | ......... H01L/21/311 |

* cited by examiner

Primary Examiner—John F. Niebling
Assistant Examiner—Walter L. Lindsay, Jr.
(74) Attorney, Agent, or Firm—McGinn & Gibb, PLLC

(57) ABSTRACT

When films of $Ru(C_2H_5C_5H_4)_2$ are formed on a substrate by means of a thermal CVD method, the films are also deposited on members around the substrate, resulting in the formation of particles on the substrate and hence a reduction in the manufacturing yield. Thus, it is necessary to clean the interior of the reaction chamber, but in a conventional cleaning process, a cleaning time is long and hence manufacturing efficiency is low, increasing manufacturing costs. To improve these, a method of manufacturing semiconductor devices according to the present invention includes: a deposition process for forming a film containing Ru on a substrate in a reaction chamber; and a cleaning process for supplying a $ClF_3$ gas to the reaction chamber so as to remove films, which were deposited on an inner surface of the reaction chamber in the deposition process, through thermochemical reactions.

5 Claims, 4 Drawing Sheets

METHOD OF MANUFACTURING SEMICONDUCTOR DEVICES

BACKGROUND OF THE INVENTION

1. Field of the Invention

The present invention relates to a method of manufacturing semiconductor devices, and more specifically, to such a semiconductor device manufacturing method capable of reducing manufacturing costs and improving the operating ratio of semiconductor manufacturing apparatuses.

2. Description of the Related Art

A deposition technology using sputtering has already been technically established and frequently used at the research level for the formation of thin films of Ru or $RuO_2$, which are candidates for the next generation DRAM capacitor electrodes. However, this technology is defective in the ability of covering stepped portions (hereinafter called "step covering ability"), and hence a thermal CVD method having a superior step covering ability is preferred for mass production processes and has been actively developed.

In the thermal CVD method, deposition raw materials are generally in the form of a liquid of an organic metal, a solution with a powder of an organic metal dissolved in a solvent or the like, these materials being vaporized by means of an vaporizer or bubbling and supplied to a substrate. Here, note that bisethyl-cyclopentadienyl-ruthenium (Ru $(C_2H_5C_5H_4)_2$) is referred to as such a raw material.

However, in cases where films of bisethyl-cyclopentadienyl-ruthenium are formed on a substrate by means of a thermal CVD method of instance, films of Ru or $RuO_2$ are deposited on members around the substrate such as, for instance, a substrate holder, and when the deposition process is continued, there would be a problem in that these films peel off, resulting in the formation of particles on the substrate and hence in a reduction in the manufacturing yield. In addition, when particles are generated, it is necessary to stop the operation of the semiconductor manufacturing apparatus for replacement of damaged component elements with new ones, and perform wet cleaning or the like. As a result, there arises another problem in that the operating ratio of the apparatus decreases to reduce productivity.

In order to cope with the above problems, it is necessary to clean a reaction chamber of the semiconductor manufacturing apparatus and remove the films deposited on the inner surface of the reaction chamber. There are methods of cleaning the films of Ru or $RuO_2$ deposited on the inner surface of the reaction chamber including a dry cleaning method and a wet cleaning method. The dry cleaning method includes, for example, a plasma etching technique using oxygen and a chlorine gas as disclosed in Japanese Patent Application Laid-Open No. Hei 8-78396, and another plasma etching technique using a $ClF_3$ gas as disclosed in Japanese Patent Application Laid-Open No. 2000-58529. However, the former technique is disadvantageous in that the etching rate for the Ru films is low, thus prolonging the etching time required to remove the films of a thickness on the order of $\mu m$ deposited on the reaction chamber. In addition, there is a drawback common to the former and latter methods in that adding a plasma function to a thermal CVD apparatus increases the manufacturing cost thereof. On the other hand, the wet cleaning method is disadvantageous in that it is necessary to open the reaction chamber to the atmosphere, thus prolonging the time required for sufficiently heating and cooling the interior of the reaction chamber with the result that the operating ratio of the apparatus is accordingly decreased. Moreover, a method of stopping the operation of the manufacturing apparatus and replacing the component members thereof on which the films are deposited with new ones involves the similar drawbacks as referred to above.

SUMMARY OF THE INVENTION

Accordingly, the object of the present invention is to provide a method of manufacturing semiconductor devices which is capable of reducing the manufacturing costs for semiconductor devices, as well as improving the operating ratio of a semiconductor manufacturing apparatus.

Bearing the above object in mind, according to a first aspect of the present invention, there is provided a method of manufacturing semiconductor devices comprising: a deposition process for forming a film containing Ru on a substrate in a reaction chamber; and a cleaning process for supplying a $ClF_3$ gas to the reaction chamber so as to remove films, which were deposited on an inner surface of the reaction chamber in the deposition process, through thermochemical reactions.

According to this method, the manufacturing costs can be reduced, and the operating ratio of a manufacturing apparatus as used for implementing this method can be improved.

In a preferred form of the first aspect of the present invention, removing the films deposited on an inner surface of the reaction chamber in the cleaning process is carried out at a temperature ranging from 300° C. to 500° C. and at a pressure ranging from 665 Pa to 6650 Pa.

Thus, it is possible to further reduce the manufacturing costs as well as further improve the operating ratio of the manufacturing apparatus.

According to a second aspect of the present invention, there is provided a method of manufacturing semiconductor devices comprising: a deposition process for forming a film containing Ru on a substrate in a reaction chamber at a prescribed temperature; and a cleaning process for supplying a $ClF_3$ gas to the reaction chamber at a temperature substantially equal to the temperature in the deposition process so as to remove films, which were deposited on an inner surface of the reaction chamber in the deposition process.

According to this method, it is not necessary to change the temperature in the reaction chamber in the course of from the cleaning process to the deposition process, and subsequently from the deposition process to the next cleaning process. This serves to improve the operating ratio of a manufacturing apparatus as used for implementing this method.

In a preferred form of the second aspect of the present invention, the pressure in the reaction chamber is made higher in the cleaning process than in the deposition process.

Thus, the etching rate of the Ru films can be further improved while maintaining the temperature in the cleaning process equal to the temperature in the deposition process. This serves to shorten the cleaning time, and improve the manufacturing efficiency as well.

In a preferred form of the third aspect of the present invention, the films deposited on an inner surface of said reaction chamber is removed in said cleaning process, through thermochemical reactions.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Embodiment 1

Figure 1:
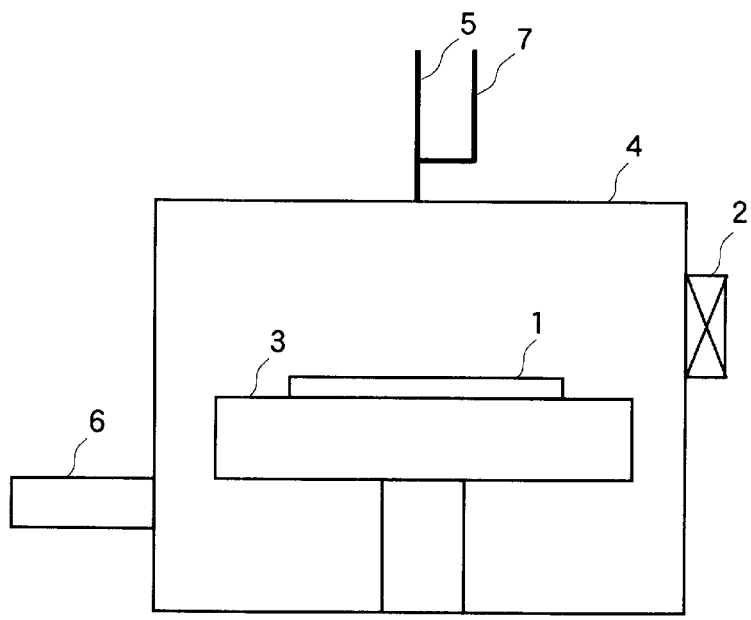
FIG. 1 is a view for explaining one example of a thermal CVD apparatus which can be used with the present invention.

FIG. 1 illustrates an example of a thermal CVD apparatus suitable for use with the present invention. In FIG. 1, the thermal CVD apparatus includes a substrate 1 disposed on a substrate holder 3, a reaction chamber 4 with a gate valve 2, a material gas feed pipe 5 connected with the reaction chamber 4 for feeding a material gas to the reaction chamber 4, an exhaust pipe 6 connected with the reaction chamber 4 for discharging the gases in the reaction chamber 4, and a ClF3 gas feed pipe 7 connected with the reaction chamber 4 for feeding a $ClF_3$ gas to the reaction chamber 4.

A deposition process according to the present invention is performed in the following manner, for instance. A substrate 1 is introduced into the reaction chamber 4 through the gate valve 2 and set up on the substrate holder 3 having a heater by means of a transfer device such as a transfer robot (not shown). Subsequently, the substrate 1 on the substrate holder 3 is together moved up to a prescribed position by means of an unillustrated heater lift mechanism and heated by an unillustrated heater incorporated in the substrate holder 3 for a predetermined period of time. After the pressure in the reaction chamber 4 has been stabilized to a desired value, a raw material gas comprising a Ru raw material gas vaporized from a Ru liquid material and oxygen is introduced into the reaction chamber 4 through the material gas feed pipe 5, and then discharged therefrom through the exhaust pipe 6, whereby thin films containing Ru such as Ru films, $RuO_2$ films, etc., are formed on the substrate 1. Here, note that the temperature and pressure in the reaction chamber 4, the flow rate of oxygen and the flow rate of the Ru raw material being supplied to the chamber 4 through the material gas feed pipe 5 are controlled by a temperature controller, a pressure controller, an oxygen flow controller and a Ru liquid material flow controller, respectively, all of them being not shown in the drawings. When the deposition process has been completed, the substrate 1 is carried to the outside from the reaction chamber 4 by means of the transfer robot.

As such a deposition process continues, films containing Ru (hereinafter, simply referred to as Ru films) are deposited on members around the substrate 1 such as, for example, the substrate holder 3, the inner surface of the reaction chamber 4, etc., and when the thickness of the films thus deposited exceeds a certain limit, the films peel off to generate particles, which might be attached to the substrate, thus reducing the manufacturing yield. Then, it is necessary to clean the reaction chamber to thereby remove the deposited Ru films, and in the cleaning process of the present invention, a $ClF_3$ gas is supplied to the reaction chamber to remove the Ru films through non-plasma thermochemical reactions. By using thermochemical reactions, it is possible to solve the under-mentioned problems which would otherwise arise when using plasma chemical reactions, thus achieving profound effects.

(1) When the plasma chemical reactions are used, it is necessary to add a plasma function to an existing hardware configuration. Therefore, measures for insulating the electrodes and shielding high frequencies are needed, and hence the manufacturing costs accordingly increase.

(2) The etching does not progress to the portions of the films where plasma can not reach due to a bias or non-uniformity in the plasma generation distribution, so that there will exist parts of the films left unremoved, or there will be caused great damage to the reaction chamber at locations where plasma locally concentrates, thus accelerating corrosion of the reaction chamber.

The Ru films of the present invention might become the form of a Ru film, a $RuO_2$ film, a mixture of a Ru film and a $RuO_2$ film existing together, or a stack of $RuO_2$ films and Ru films according to the deposition conditions such as the temperature, the pressure, the gas flow rate, etc. (cf. Japanese Patent Application No. 2000-99754).

It is preferred that in the cleaning process, the $ClF_3$ gas be introduced into the reaction chamber under the condition of a temperature of 300–500° C. and a pressure of 665–6,650 Pa. In addition, preferably, the flow rate of $ClF_3$ gas is 500–2,000 sccm.

Figure 2:
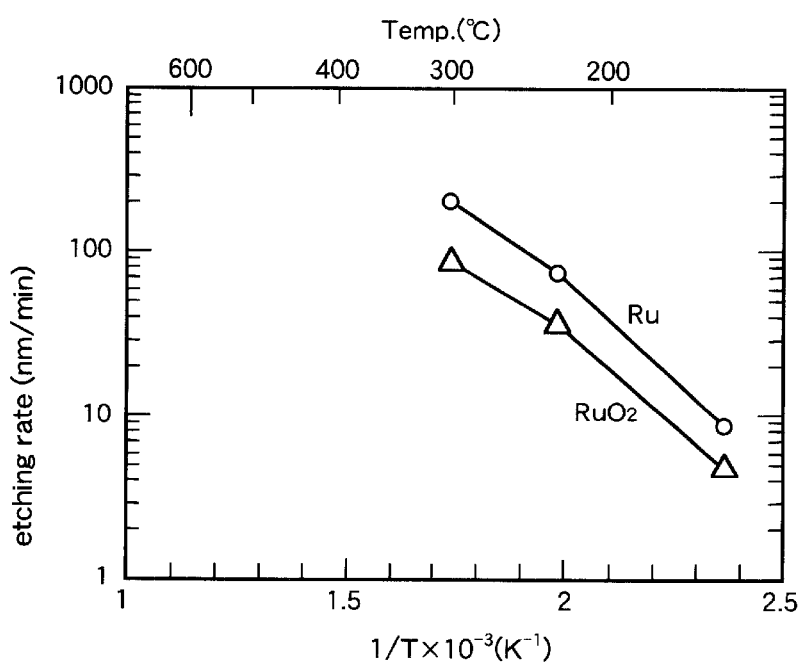
FIG. 2 is a view illustrating the temperature dependency of the etching rate of a ClF3 gas with respect to Ru films or $RuO_2$ films.

FIG. 2 is a view illustrating the temperature dependency of the etching rate of the $ClF_3$ gas with respect to the Ru film or the $RuO_2$ film. From FIG. 2, it is understood that both the Ru film and the $RuO_2$ film can be etched by using the $ClF_3$ gas. Also, it is understood that the etching rate increases as the temperature rises. Here, note that the experimental conditions of FIG. 2 are as follows: the pressure is 931 Pa (7 Torr); the flow rate of the $ClF_3$ gas is 500 sccm; and the flow rate of $N_2$ gas is 1,000 sccm.

Figure 3:
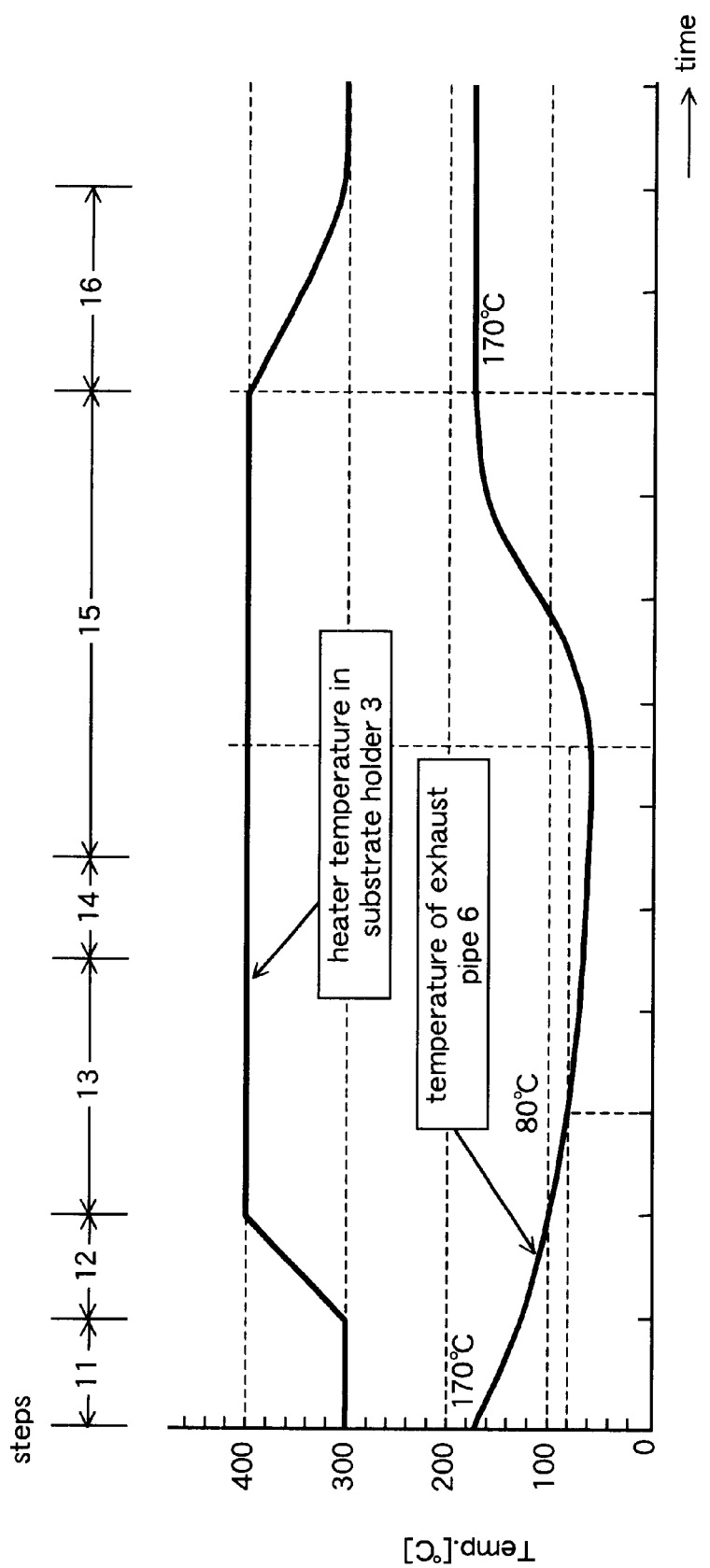
FIG. 3 is a view explaining the operating procedure of a cleaning process according to a first embodiment of the present invention.

Now, the operating procedure of the cleaning process according to the first embodiment will be described while referring to FIG. 3.

First of all, an unillustrated heater provided on the exhaust pipe 6 is turned off in step 11, and raw material gases remaining in the reaction chamber 4 are exhausted by a $N_2$ purge gas. The reason why the heater provided on the exhaust pipe 6 is turned off is to prevent corrosion of the exhaust pipe 6 with the $ClF_3$ gas. It is desirable to lower the temperature of the exhaust pipe 6 to 100° C. or less in order to achieve such a preventive effect. Here, note that it is desirable to exchange an unillustrated trap provided on the exhaust pipe 6 in the semiconductor manufacturing apparatus in step 11 in order to avoid the generation of a strong acid due to the reaction of Ru components such as, for example, bisethyl-cyclopentadienyl-ruthenium ($Ru(C_2H_5C_5H_4)_2$) collected in the trap and the $ClF_3$ gas. Alternatively, a by-pass exhaust line may be provided for by-passing the trap, so that during cleaning, the exhaust path is switched over to the by-pass exhaust line so as to discharge the $ClF_3$ gas from the reaction chamber while by-passing the trap. Otherwise, a deposition process exhaust line and a cleaning process exhaust line are separately provided so that these exhaust lines are switched over from one to the other between the deposition process and the cleaning process. Switching the exhaust path in this manner makes it unnecessary to exchange the trap, and hence is more desirable than the case of exchanging the trap.

Next, in step 12, the temperature of the heater incorporated in the substrate holder 3 is raised so that the temperature in the surroundings of the substrate to which thin films are most liable to adhere is elevated from a temperature of about 300° C. suitable for formation of thin films up to a temperature of about 400° C. suitable for cleaning. Subsequently, in step 13, the reaction chamber 4 is vacuum discharged and purged by $N_2$ gas to a desired pressure. Then, in step 14, a $ClF_3$ gas is supplied to the reaction chamber 4 from the $ClF_3$ gas feed pipe 7 thereby to remove the Ru films which were attached to the inner surface of the reaction chamber in the deposition process. Thereafter, in step 15, the heater provided on the exhaust pipe 6 is turned on to heat the exhaust pipe 6 to an appropriate temperature such as 170° C. for instance, and the reaction chamber 4 is purged by $N_2$ gas to exhaust the $ClF_3$ gas and by-products remaining in the reaction chamber 4. After the reaction chamber 4 has been exhausted, the temperature of the heater in the substrate holder 3 is lowered in step 16, whereby the temperature in the surroundings in the substrate 1 falls from the cleaning temperature of 400° C. to the deposition temperature of about 300° C. Thereafter, pre-coating or deposition on a dummy substrate or the like for example is performed to ascertain the characteristics thereof, as in a usual semiconductor manufacturing process. Note that such pre-coating is to restore or make the environment, the film deposition rate (deposition speed), etc., in the reaction chamber equal to those before cleaning, and at the same time to decrease the contamination of the interior of the reaction chamber as well as the generation of particles.

In addition, the temperature, the pressure, the $ClF_3$ gas flow rate and the $N_2$ flow rate in the cleaning process are controlled by a temperature controller, a pressure controller, a $ClF_3$ gas flow rate controller, and an $N_2$ flow controller, all of which are not illustrated in the drawings.

Embodiment 2

Although in the above-mentioned first embodiment, the cleaning process is performed at a higher temperature than the temperature in the deposition process so as to remove the Ru films at a high etching rate, a second embodiment of the present invention is an example in which a $ClF_3$ gas is introduced into the reaction chamber while maintaining the temperature of the heater in the substrate holder substantially at the same temperature as in the deposition process. By carrying out the cleaning process in this manner, it is not necessary to change the temperature of the heater in the course of from a deposition process to a cleaning process, and subsequently from the cleaning process to the next new deposition process, and hence this is preferable from a point of view of the improved operating ratio of the apparatus even though the etching rate decreases to a little extent.

Figure 4:
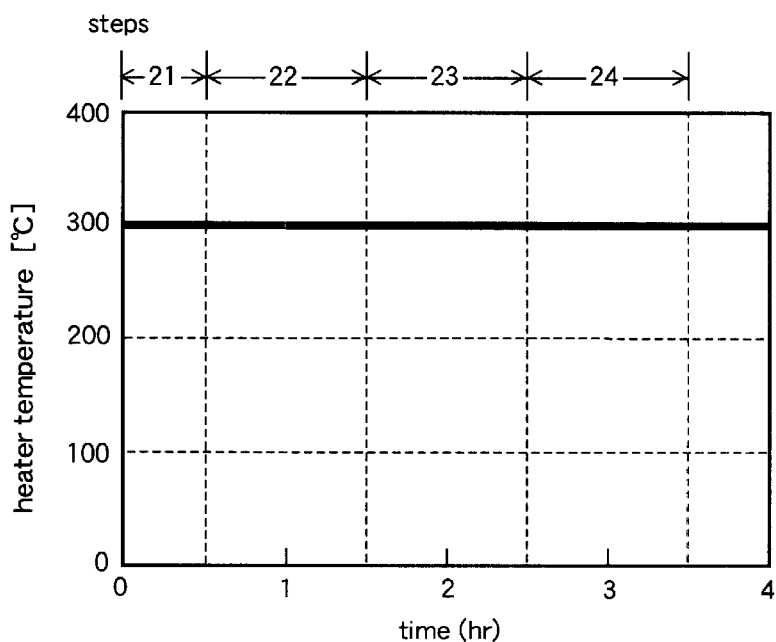
FIG. 4 is a view explaining the operating procedure of a cleaning process according to a second embodiment of the present invention.

Now, the operating procedure of the cleaning process according to the second embodiment will be described in detail while referring to FIG. 4.

First, the interior of the reaction chamber 4 is purged by $N_2$ gas to discharge the raw material gases remaining therein in step 21. Here, note that it is desirable to exchange an unillustrated trap provided on the exhaust pipe 6 in the semiconductor manufacturing apparatus in step 21 in order to avoid the generation of a strong acid due to the reaction of Ru components such as, for example, bisethyl-cyclopentadienyl-ruthenium ($Ru(C_2H_5C_5H_4)_2$) collected in the trap and the $ClF_3$ gas. Alternatively, a by-pass exhaust line may be provided for by-passing the trap so that during cleaning, the exhaust path is switched over to the by-pass exhaust line so as to discharge the $ClF_3$ gas from the reaction chamber while by-passing the trap. Otherwise, a deposition process exhaust line and a cleaning process exhaust line are separately provided so that these exhaust lines are switched over from one to the other between the deposition process and the cleaning process. Switching the exhaust path in this manner makes it unnecessary to exchange the trap, and hence is more desirable than the case of exchanging the trap.

Subsequently, in step 22, the reaction chamber 4 is vacuum discharged and purged by $N_2$ gas to a desired pressure while supplying a $ClF_3$ gas to the reaction chamber 4 from the $ClF_3$ gas feed pipe 7 thereby to remove the Ru films which were attached to the inner surface of the reaction chamber in the deposition process. Thereafter, in step 23, the reaction chamber 4 is purged by $N_2$ gas to exhaust the $ClF_3$ gas and by-products remaining in the reaction chamber 4. After the reaction chamber 4 has been exhausted, pre-coating or deposition on a dummy substrate or the like for example is performed to ascertain the characteristics thereof, as in a usual semiconductor manufacturing process.

Figure 5:
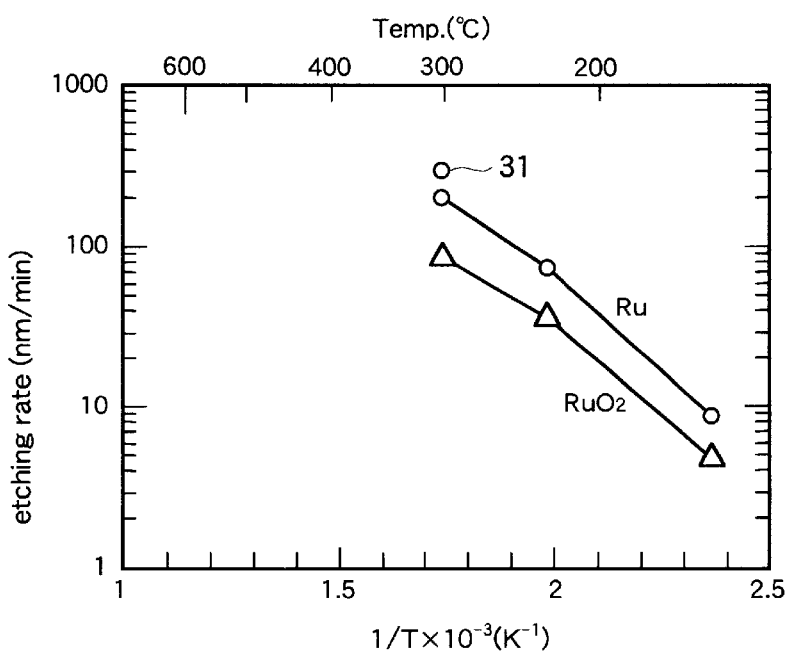
FIG. 5 is a view illustrating an increase in the etching rate when the pressure in a reaction chamber is increased.

In the second embodiment, it is preferable that the pressure in the reaction chamber in the cleaning process be made higher than in the deposition process, so that the etching rate of the Ru films can be further improved even at the same temperature as in the deposition process. FIG. 5 is a view showing an increase in the etching rate when the pressure in the reaction chamber is increased to 3,990 Pa (30 Torr) under the same conditions as illustrated in FIG. 2 with reference to the first embodiment. For the sake of reference, there is also depicted the temperature dependency of the etching rate of the $ClF_3$ gas with respect to the Ru films or $RuO_2$ films when the pressure in the reaction chamber illustrated in FIG. 2 is 931 Pa (7 Torr). From FIG. 5, it can be seen that the etching rate is improved by increasing the pressure in the reaction chamber from 931 Pa (7 Torr) to 3,990 Pa (30 Torr) (symbol 31) even under the same temperature condition of 300° C.

In addition, in the second embodiment, the Ru films can be removed through reactions other than thermochemical reactions. To this end, by adding a plasma function to the thermal CVD apparatus, for instance, it is possible to remove the Ru films through plasma reactions.

In any of the above-mentioned embodiments, a dummy substrate (e.g., a quartz or similar substrate) may be mounted on the substrate holder 3 for the purposes of protecting a substrate mounting surface of the substrate holder 3 from the $ClF_3$ gas before the $ClF_3$ gas is supplied to the reaction chamber 4, and of preventing the cleaning gas from flowing into the heater in the substrate holder 3.

Figure 6:
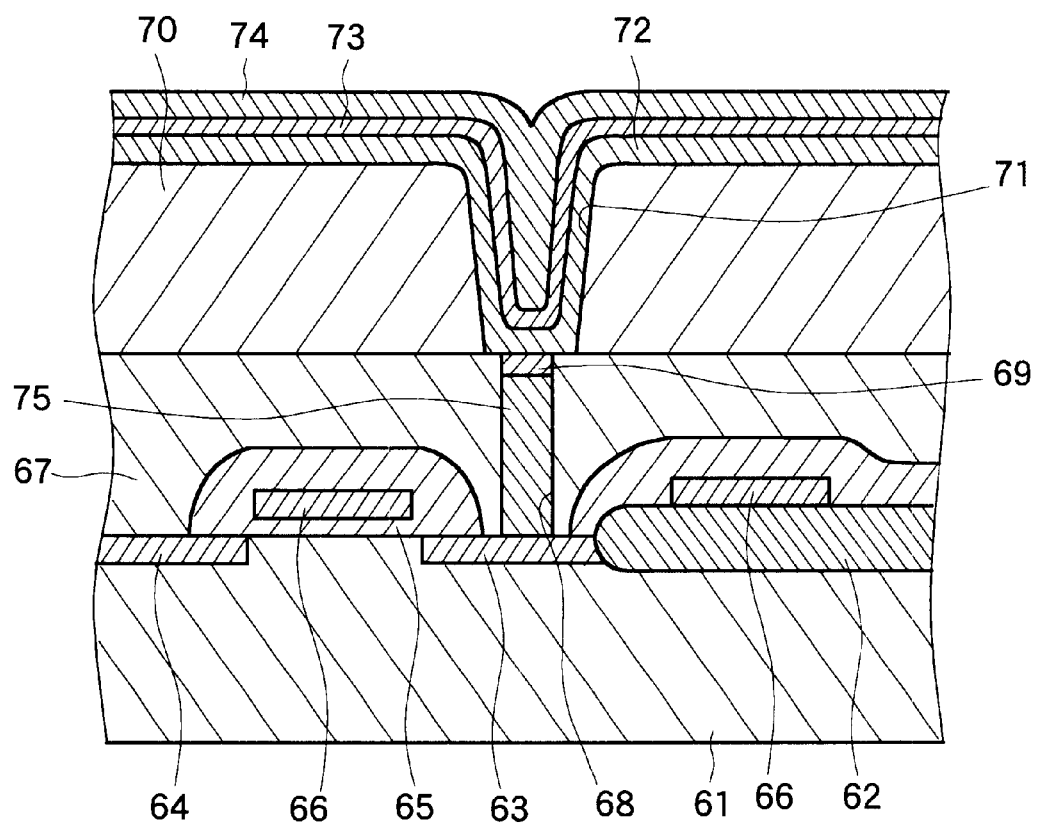
FIG. 6 is a cross sectional view of a DRAM.

FIG. 6 is a cross sectional view illustrating a part of a DRAM which includes ruthenium films or ruthenium oxide films formed by using the manufacturing method of the present invention.

As shown in FIG. 6, on a surface of a silicon substrate 61, there are formed field oxide films 62 for forming a multitude of transistor-forming regions in a mutually separated manner. Also, on the surface of the silicon substrate 61, there are formed source electrodes 63 and drain electrodes 64 with gate electrodes 66 acting as word lines being disposed therebetween via gate insulation films 65, respectively, on which a first interlayer insulation film 67 is provided. Contact holes 68 are formed through the first interlayer insulation film 67, and a barrier metal 69 and a plug electrode 75 connected to a corresponding one of the source electrodes 63 are formed in each of the contact holes 68. On the first interlayer insulation film 67, there is formed a second interlayer insulation film 70 through which contact holes 71 are formed. On the second interlayer insulation film 70 and in the contact holes 71, there is provided a capacitance lower electrode 72 which is made of ruthenium and connected with the barrier metals 69. Formed on the capacitance lower electrode 72 is a capacitance insulation film 73 made of Ta2O5 on which is formed a capacitance upper electrode 74 made of ruthenium, titanium nitride, or the like. That is, with this DRAM, a capacitor cell is connected with the source electrode 63 of a MOS transistor.

Next, reference will be made to a method of manufacturing the DRAM shown in FIG. 6. First, the field oxide film 62 is formed in the surroundings of each transistor-forming region on the surface of the silicon substrate 61 by means of a LOCOS process. Subsequently, the gate electrode 66 is formed in each transistor-forming region through the corresponding gate insulation layer 65. Thereafter, impurities are introduced into the surface of the silicon substrate 61 by ion-implantation using the field oxide film 62 and the gate electrode 66 as masks, thus forming the source electrode 63 and the drain electrode 64 in a self-aligned manner. After each gate electrode 66 is covered with an insulating film, the first interlayer insulation film 67 is formed on the substrate 61. Then, each contact hole 68 through which a corresponding source electrode 63 is exposed is formed through the first interlayer insulation film 67, and the plug electrode 75 and the barrier metal 79 are formed in each contact hole 68. Subsequently, the second interlayer insulation film 70 is formed on the first interlayer insulation film 67, and the contact holes 71 are formed through the interlayer insulation film 70 so as to expose the corresponding barrier metals 69, respectively. Then, a ruthenium film or a ruthenium oxide film formed according to the manufacturing method of the present invention is deposited on the interlayer insulation film 70 and in the contact holes 71, and patterning is carried out on the ruthenium film to provide the capacitance lower electrode 72. The capacitance insulation film 73 made of $Ta_2O_5$ is then formed on the capacitance lower electrode 72, and the capacitance upper electrode 74 made of ruthenium, titanium nitride, etc., is in turn formed on the capacitance insulation film 73.

Thus, according to the present invention, there is provided a method of manufacturing semiconductor devices which is capable of reducing the manufacturing costs, and of improving the operating ratio of the manufacturing apparatus as well.

While the invention has been described in terms of preferred embodiments, those skilled in the art will recognize that the invention can be practiced with modifications within the spirit and scope of the appended claims.

What is claimed is:

1. A method of manufacturing semiconductor devices comprising:
a deposition process for forming a film containing Ru on a substrate in a reaction chamber; and
a cleaning process for supplying a $ClF_3$ gas to said reaction chamber so as to remove films, which were deposited on an inner surface of said reaction chamber in said deposition process, through thermochemical reactions, wherein in said cleaning process, removing the films deposited on the inner surface of said reaction chamber is carried out at a pressure ranging from 665 Pa to 6,650 Pa.

2. A method of manufacturing semiconductor devices comprising:
a deposition process for forming a film containing Ru on a substrate in a reaction chamber; and
a cleaning process for supplying a $ClF_3$ gas to said reaction chamber so as to remove films, which were deposited on an inner surface of said reaction chamber in said deposition process, through thermochemical reactions, wherein in said cleaning process, removing the films deposited on the inner surface of said reaction chamber is carried out at a temperature ranging from 300 Celsius to 500 Celsius and at a pressure ranging from 665 Pa to 6,650 Pa.

3. The method of claim 1, wherein said deposition process for forming said film containing Ru on said substrate in said reaction chamber is at a prescribed temperature, and
wherein said cleaning process for supplying a $ClF_3$ gas to said reaction chamber is at a temperature substantially equal to the temperature in said deposition process so as to remove films, which were deposited on an inner surface of said reaction chamber in said deposition process.

4. The method of manufacturing semiconductor devices according to claim 3, wherein the pressure in said reaction chamber is made higher in said cleaning process than in said deposition process.

5. The method of manufacturing semiconductor devices according to claim 4, wherein the films deposited on an inner surface of said reaction chamber is removed in said cleaning process, through thermochemical reactions.

\* \* \* \* \*